United States Patent
Vetter et al.

(10) Patent No.: US 9,728,382 B2
(45) Date of Patent: Aug. 8, 2017

(54) EVAPORATION SOURCE

(71) Applicant: SULZER METAPLAS GMBH, Bergisch Gladbach (DE)

(72) Inventors: Joerg Vetter, Bergisch Gladbach (DE); Stefan Esser, Aachen (DE); Juergen Mueller, Olpe (DE); Georg Erkens, Aachen (DE)

(73) Assignee: OERLIKON SURFACE SOLUTIONS AG, PFAEFFIKON, Pfaeffikon (CH)

( * ) Notice: Subject to any disclaimer, the term of this patent is extended or adjusted under 35 U.S.C. 154(b) by 207 days.

(21) Appl. No.: 14/163,650

(22) Filed: Jan. 24, 2014

(65) Prior Publication Data

US 2014/0174920 A1    Jun. 26, 2014

(30) Foreign Application Priority Data

Dec. 21, 2012  (EP) .................... 121 98 948

(51) Int. Cl.
  *C23C 14/34*  (2006.01)
  *H01J 37/34*  (2006.01)
  (Continued)

(52) U.S. Cl.
  CPC ........ *H01J 37/3414* (2013.01); *C23C 14/243* (2013.01); *C23C 14/325* (2013.01);
  (Continued)

(58) Field of Classification Search
  CPC . C23C 14/243; C23C 14/325; C23C 14/3407; H01J 37/3414; H01J 37/32055;
  (Continued)

(56) References Cited

U.S. PATENT DOCUMENTS 5,262,032 A * 11/1993 Hartig ................. C23C 14/3407
                                                         204/192.12
5,985,115 A * 11/1999 Hartsough .......... H01J 37/3408
                                                         204/298.09
(Continued)

FOREIGN PATENT DOCUMENTS

DE   32 29 969    4/1983
DE    217 964    1/1985
(Continued)

OTHER PUBLICATIONS

European Search Report issued in counterpart European application No. 12 19 8948 (7 pages), Jun. 2013.

*Primary Examiner* — John Brayton
(74) *Attorney, Agent, or Firm* — Greenblum & Bernstein, P.L.C.

(57) ABSTRACT

Evaporation source, in particular for use in a sputtering process or in a vacuum arc evaporation process, preferably a cathode vacuum arc evaporation process. The evaporation source includes an inner base body which is arranged in an outer carrier body and which is arranged with respect to the outer carrier body such that a cooling space in flow communication with an inlet and an outlet is formed between the base body and the carrier body. In accordance with the invention, the cooling space includes an inflow space and an outflow space, and the inflow space is in flow communication with the outflow space via an overflow connection for the cooling of the evaporation source such that a cooling fluid can be conveyed from the inlet via the inflow space the overflow connection and the outflow space to the outlet.

24 Claims, 4 Drawing Sheets

(51) Int. Cl.
*C23C 14/24* (2006.01)
*C23C 14/32* (2006.01)
*H01J 37/32* (2006.01)

(52) U.S. Cl.
CPC .... *C23C 14/3407* (2013.01); *H01J 37/32055* (2013.01); *H01J 37/32614* (2013.01); *H01J 37/3423* (2013.01); *H01J 37/3435* (2013.01); *H01J 37/3497* (2013.01)

(58) Field of Classification Search
CPC ............. H01J 37/32614; H01J 37/3423; H01J 37/2435; H01J 37/3497
USPC .......................... 204/298.09, 298.21, 298.22
See application file for complete search history.

(56) References Cited

U.S. PATENT DOCUMENTS

| | | | |
|---|---|---|---|
| 7,842,167 B2 * | 11/2010 | Henrich | C23C 14/3407 204/192.12 |
| 2007/0089986 A1 | 4/2007 | Richert et al. | |
| 2011/0036708 A1 * | 2/2011 | Wu | H01J 37/3405 204/298.08 |
| 2012/0193226 A1 | 8/2012 | Beers | |

FOREIGN PATENT DOCUMENTS

| | | |
|---|---|---|
| DE | 10 2011 075 5 | 11/2012 |
| EP | 1 173 629 | 8/2003 |
| EP | 2 159 821 | 3/2010 |
| EP | 2 484 798 | 8/2012 |
| WO | WO 90/02216 | 3/1990 |
| WO | WO 00/56946 | 9/2000 |
| WO | WO 2007/050305 | 5/2007 |

* cited by examiner

EVAPORATION SOURCE

CROSS-REFERENCE TO RELATED APPLICATIONS

The present application is based on European Patent Application No. EP 1 219 8948.7 filed Dec. 21, 2012, the disclosure of which is expressly incorporated by reference herein in its entirety.

BACKGROUND OF THE INVENTION

1. Field of the Invention

The invention relates to an evaporation source, in particular for use in a sputtering process or in a vacuum evaporation process, preferably a cathode vacuum evaporation process.

2. Discussion of Background Information

A whole series of different chemical, mechanical and physical techniques are known from the prior art for the application of layers or layer systems on the most varied substrates, each of which techniques are valid and have corresponding advantages and disadvantages in dependence on the demand and on the area of use.

Processes are in particular common for the application of comparatively thin layers or films in which the surface of a target is changed into the vapor form in an arc or atoms from a surface of a target are changed into the vapor form by means of ionized particles, with the vapor thus formed then being able to be deposited on a substrate as a coating.

In a conventional embodiment of cathode atomization, the target is connected in a sputtering process to a negative non-pulsed DC voltage source or e.g. to a unipolar or bipolar pulsed source or is operated in HIPIMs mode or is connected to a radio frequency power source. The discharge is as a rule amplified by magnet systems. Magnetron atomization is then spoken of. The substrate is the material to be coated and it is located opposite the target, for example. The substrate can be grounded, floating, biased, heated, cooled or can be subjected to a combination thereof. A process gas is introduced into the process chamber, which inter alia contains the process electrodes and the substrate, to create a gas atmosphere in which a glow discharge is triggered and can be maintained. The gas pressures range in dependence on the application from a few tenths of a Pascal to several Pascals. Argon is a frequently used atomizer gas.

When the glow discharge is triggered, positive ions impact the surface of the target and predominantly release neutral target atoms by impact force transmission. They condense on the substrate to form thin films. There are additionally other particles and radiations which are generated by the target and all have film-forming properties (secondary electrons and ions, desorbed gases and photons). The electrons and negative ions are accelerated toward the substrate platform and bombard it and the growing film. In some cases, a bias potential is applied to the substrate holder, for example, so that the growing film is exposed to the bombardment with positive ions. This process is also known as bias atomization or ion plating.

In certain cases, not only argon is used, but also other gases or gas mixtures. This typically includes some types of reaction atomizer processes in which a composition is synthesized by atomization of a metal target (e.g. B, Ti) in an at least partly reactive reaction gas to form a composition of the metal and the reaction gas types (e.g. titanium oxides). The atomization yield is defined as the number of atoms expelled from the target surface per indecent ion. It is an essential parameter for characterizing the atomizer process.

An estimated one percent of the energy incident on a target surface typically results in the expulsion of atomized particles; 75% of the incident energy results in a heating of the target and the remainder is dissipated by secondary electrons, for example, which can bombard and heat the substrate. An improved process known as magnetron atomization uses magnetic fields for conducting the electrons away from the substrate surface, whereby the heat effect is reduced.

For a given target material, the application rate and the uniformity are influenced inter alia by the system geometry, the target voltage, the atomizer gas, the gas pressure and the electrical power applied to the process electrodes.

One used physical coating process is the known arc evaporation in its many embodiments.

In arc evaporation, the target material is evaporated by the effect of vacuum arcs. The target source material is the cathode in the arc circuit. The base components of a known arc evaporation system include a vacuum chamber, a cathode and an arc current connection, parts for igniting an arc on the cathode surface, an anode, a substrate and a power connection for a substrate bias voltage. The arcs are maintained by voltages in the range from 15-50 volts depending on the target cathode material which is used. Typical arc currents lie in the range from 30-400 A. The arc ignition takes place by the customary ignition processes known to the skilled person.

The evaporation of the target material from the cathode which forms the target is produced as the result of a cathode arc spot which in the simplest case is moved without regulation on the cathode surface at speeds of typically 10 m/s. The arc spot movement can in this respect, however, also be controlled with the aid of suitable confinement limits and/or magnetic fields. The target cathode material can be a metal or a metal alloy, for example.

The arc coating process is considerably different from other physical vapor coating processes. The core of the known arc processes is the arc spot which generates a material plasma. A high percentage, e.g. 30%-100%, of the material evaporated by the cathode surface is ionized as a rule, with the ions being able to exist in different charge states in the plasma, for example as Ti+, Ti2+, Ti3+, etc. The kinetic energy of the ions can in this respect move in the range from e.g. 10-100 eV.

These features result in coatings which can be of a very high quality and can have specific advantages in comparison with those coatings which are applied by other physical vapor coating processes.

The layers applied using arc evaporation usually show a high quality over a wide range of coating conditions. Stoichiometric compound films, for example, having very high adhesion and a high density can thus be manufactured which deliver high coating quantities for metals, alloys and compositions having excellent coating uniformity over a wide range of the reaction gas pressure. A further advantage among others is also the comparatively low substrate temperatures and the relatively simple manufacture of compound films.

The cathode arc results in a plasma discharge within the material vapor released from the cathode surface. The arc spot is normally some micrometers large and has current densities of 10 amperes per square micrometer. This high current density causes a lightning fast evaporation of the starting material. The vapor generated is composed of electrons, ions, neutral vapor atoms and microdroplets. The electrons are accelerated toward the clouds of positive ions. The emissions of the cathode light spot are relatively constant over a wide range of the arc current when the cathode spot is divided into a plurality of dots. The average current per dot depends on the nature of the cathode material.

In this respect, the geometry of the evaporation source also often plays a substantial role. It is thus known to use both rectangular and cylindrical evaporation sources. The selection of the geometry of the evaporation source can in this respect depend on a plurality of parameters and marginal conditions of the specific coating application.

A disadvantage of the coating plant and of the process in accordance with WO 90/02216 is inter alia that a uniform quality of the coatings is in particular not ensured. The quality of the applied layers thus varies as the consumption of the cathodes increases if the method parameters are not tracked in a complex and/or expensive manner. This is as known inter alia due to the fact that the rectangular cathodes are consumed in a non-uniform manner so that, with the same process parameters, the quality of the coating vapor becomes increasingly worse as the erosion of the cathodes increases because e.g. disturbing droplets form to an increasing degree in the arc evaporation, which has a negative effect on the layers. To keep these negative effects within limits, the cathodes have to be replaced prematurely, which is correspondingly expensive and complicated.

A further disadvantage in addition to the irregular erosion of the cathodes is that a control of the arc on the cathode is very difficult and complicated, if possible at all.

It is therefore frequently more advantageous to use a cylindrical cathode, which has the advantage, as is known, that the cylindrical cathode is rotatable about its cylinder axis and the consumption of the target material can thus be handled better. These problems have already been discussed in detail before in EP 2 159 821. By using evaporation sources in accordance with EP 2 159 821, the quality of the applied layers does not change with increasing consumption of the cathodes and the method parameters do not have to be tracked in a complex and/or expensive manner. This is inter alia due to the fact that the cylindrical cathodes are consumed uniformly so that, with the same process parameters, the quality of the coating vapor remains the same as the erosion of the cathodes increases and therefore does not become worse because e.g. disturbing droplets form to an increasing degree in the arc evaporation, which has a negative effect on the layers. Since these negative effects practically no longer occur with evaporation sources in accordance with EP 2 159 821, the cathodes no longer have to be exchanged prematurely, which results in corresponding significant cost savings.

A problem of cylindrical cathodes which has not yet been really satisfactorily solved is, however, their cooling. As initially mentioned, a large portion of the energy introduced into the evaporation sources is converted into heat which naturally has to be conducted away from the evaporation source again. A number of proposals are known for this purpose from the prior art.

DD 217 964 A3, for example, describes a cylindrical evaporation source in which the cooling is essentially conducted in proximity with the cylinder axis of the evaporation source. EP 1 173 629 B1 shows a similar solution. A substantial disadvantage of such solutions is that the cooling takes up a significant space in the interior of the evaporation source which is then not available for further necessary installations such as for magnet systems which the skilled person would often advantageously like to accommodate in the interior of the evaporation source. It was in addition shown that the conducting away of the heat is frequently not sufficiently efficient in such cooling systems, the installations are complicated and thus require frequent maintenance, which all in all naturally also drives up costs.

SUMMARY OF THE EMBODIMENTS

Therefore, embodiments of the invention provide an improved evaporation source, in particular for use in a sputtering process or in a vacuum arc evaporation process, specifically a cathode vacuum arc evaporation process in which the problems with the cooling known from the prior art no longer occur.

In embodiments, there is provided an evaporation source comprising a cylindrical carrier body, a cylindrical base body arranged within the outer carrier body, a cooling fluid space arranged between an outer surface of the base body and an inner surface of the carrier body, and a partition wall separating the cooling space into an inflow space and an outflow space. The inflow space has an arc-shaped cross-section. The outflow space has an arc-shaped cross-section. The cooling fluid space is configured to allow fluid to move in one direction within the inflow space and in an opposite direction within the outflow space.

In embodiments, the partition wall comprises two partition walls.

In embodiments, the inflow space and the outflow space have a same arc-shaped cross-section.

In embodiments, the partition wall comprises two oppositely arranged partition walls.

In embodiments, the evaporation source further comprises a main internal space located within the base body sized and configured to receive therein a magnet system.

In embodiments, the evaporation source further comprises a cooling fluid inlet a cooling fluid outlet and an outflow connection arranged on an opposite end from the cooling fluid inlet and the cooling fluid outlet.

In embodiments, the carrier body and the base body are coaxially arranged and have an axis that coincides with an axis of the evaporation source.

In embodiments, at least the carrier body is rotatable about an axis of the evaporation source.

In embodiments, at least the base body is rotatable about an axis of the evaporation source.

In embodiments, the evaporation source further comprising one of a fixing plate adapted to fix the carrier body to the base body and a fixing element coupled to a fixing plate.

In embodiments, the evaporation source further comprises one of a thermal expansion element coupled to the fixing plate and a spring coupled to the fixing plate.

In embodiments, at least one of the carrier body comprises a target material or a cylindrical target material is arranged on an outer surface of the carrier body.

In embodiments, at least one of the inflow space is structured and arranged to generate turbulence in the cooling fluid flowing therein, the outflow s ace is structured and arranged to generate turbulence in the cooling fluid flowing therein, or a turbulence body is arranged within the evaporation source and is adapted to generate turbulence in the cooling fluid.

In embodiments, at least one of the inlet is a meandering inlet or the outlet is a meandering outlet.

In embodiments, the evaporation source further comprises a magnet system space located within the base body sized and configured to contain therein one of a movable carrier system, a magnet having a predetermined magnetic field strength, or a magnet having a predetermined magnetic field shape.

In embodiments, the evaporation source is usable in one of a sputtering process, a vacuum arc evaporation process or a cathode vacuum arc evaporation process.

In embodiments, there is provided an evaporation source comprising a carrier body, a base body arranged within the outer carrier body, a cooling fluid space arranged between an outer surface of the base body and an inner surface of the carrier body, a magnet receiving space located within the base body, and partition walls separating the cooling space into an arc-shaped inflow space and an arc-shaped outflow space. A cooling fluid moves within the inflow space and the outflow space without passing through the magnet receiving space.

In embodiments, there is provided an evaporation source comprising a cylindrical carrier body, a target material arranged on an outer cylindrical surface of the carrier body, a cylindrical base body arranged within the outer carrier body, a cooling fluid space arranged between an outer surface of the base body and an inner surface of the carrier body, a magnet receiving space located within the base body, and oppositely arranged partition walls separating the cooling space into an arc-shaped inflow space and an arc-shaped outflow space. A cooling fluid moves within the inflow space along a direction parallel to an axis of the carrier body and within the outflow space parallel to an axis of the carrier body and in an opposite direction.

The dependent claims relate to particularly advantageous embodiments of the invention.

Embodiments thus relate to an evaporation source, in particular for use in a sputtering process or in a vacuum arc evaporation process, preferably a cathode vacuum arc evaporation process. The evaporation source comprises an inner base body which is arranged in an outer carrier body and which is arranged with respect to the outer carrier body such that a cooling space in flow communication with an inlet and an outlet is formed between the base body and the carrier body. In accordance with the invention, the cooling space comprises an inflow space and an outflow space, and the inflow space is in flow communication with the outflow space via an overflow connection for the cooling of the evaporation source such that a cooling fluid can be conveyed from the inlet via the inflow space, the overflow connection and the outflow space to the outlet.

An extremely efficient cooling of the cylindrical evaporation source is thus ensured by the present invention because the heat introduced into the evaporation source is absorbed and efficiently transported off practically directly at the site of its input into the evaporation source by the cooling fluid, which is preferably water and which circulates in the cooling space, by the arrangement of the cooling space adjacent to the outer carrier body.

Not only the interior of the evaporation space and possibly components accommodated therein such as a magnet system, electrical lines or electronic devices, etc. are thus efficiently protected against inordinate heat input and excessive temperatures. The cooling also takes up substantially no space or only very little space in the interior, i.e. in an evaporation source in accordance with the invention, a considerable free space is available in its interior for accommodating necessary components such as a magnet system, a carrier system for adjusting the magnet system or other electrical, electronic or mechanical devices. No corrosive attack takes place due to the avoidance of the contact of the aforesaid components (e.g. magnets and yokes) with the cooling fluid so that the components do not have to be protected against corrosion in a complex and/or expensive manner and thereby have a considerably longer service life.

In a preferred embodiment of an evaporation source in accordance with the invention, the outer carrier body is a cylindrical target carrier and/or the inner carrier body is a cylindrical base cooling body. In this respect, the outer carrier body is preferably arranged coaxial to the base body with respect to an evaporator axis and/or the carrier body and/or the base body is/are arranged rotatable about the evaporator axis, wherein the carrier body can be a monolithic carrier body, i.e. the carrier body can be manufactured from a target material to be evaporated. The outer carrier body itself can thus form the target in the actual sense. It is self-explanatory in this respect that the carrier body can also be a non-monolithic carrier body in which the target material can be applied to the outer carrier body in a manner known per se. The inner base body and the outer carrier body can in this respect be produced from any suitable material, e.g. the inner base body from stainless steel and the outer carrier body from aluminum. In this respect, in particular the inner base body can naturally also have a shape differing from the cylinder shape in special cases.

In practice, the base body particularly advantageously surrounds a magnet system space free of the cooling fluid, wherein the inflow space can be separated from the outflow space by a partition wall.

In many embodiments, a common fixing plate in this respect fixes the carrier body to the base body, wherein the fixing plate is particularly preferably fixed to the base body by a fixing element, in particular by a screw. To compensate a different thermal expansion of the outer carrier body and the inner base body, an expansion element, in particular an expansion element in the form of a spiral spring or of another spring, can particularly advantageously be provided so that in the event of a temperature change no thermally induced mechanical strains occur between the components of the evaporation source and in particular mechanical strains on the carrier body and base body are avoided.

It is self-explanatory in this respect that more than two, that is also a plurality of, inflow spaces and/or outflow spaces and/or corresponding overflow connections between the inflow spaces and the outflow spaces can be provided and in special embodiments, a turbulence element can be provided in the inflow space and/or in the outflow space and/or in the overflow connection to generate turbulence in the cooling fluid. The inlet and/or the outlet can also comprise a turbulence body for generating turbulence in the cooling fluid. In this respect, the inlet and/or the outlet can likewise have special geometrical features in dependence on the requirements; e.g. the inlet and/or the outlet can be formed in a meaning manner, in particular meandering about the carrier body.

All these measures in this respect primarily serve to improve the cooling efficiency.

It is understood that in practice further components can be provided which are required in practice in an evaporation source in accordance with the invention know to the skilled person per se. A magnet system can e.g. in particular be arranged in the magnet system space, wherein the magnet systems can particularly preferably be provided at a movable carrier system such that a strength and/or a shape of a magnetic field can be set in a predefinable range in accordance with a predefinable scheme such as is familiar to the skilled person from the prior art.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein:

FIG. 1b shows a section along the line I-I in accordance with FIG. 1a;

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1A:
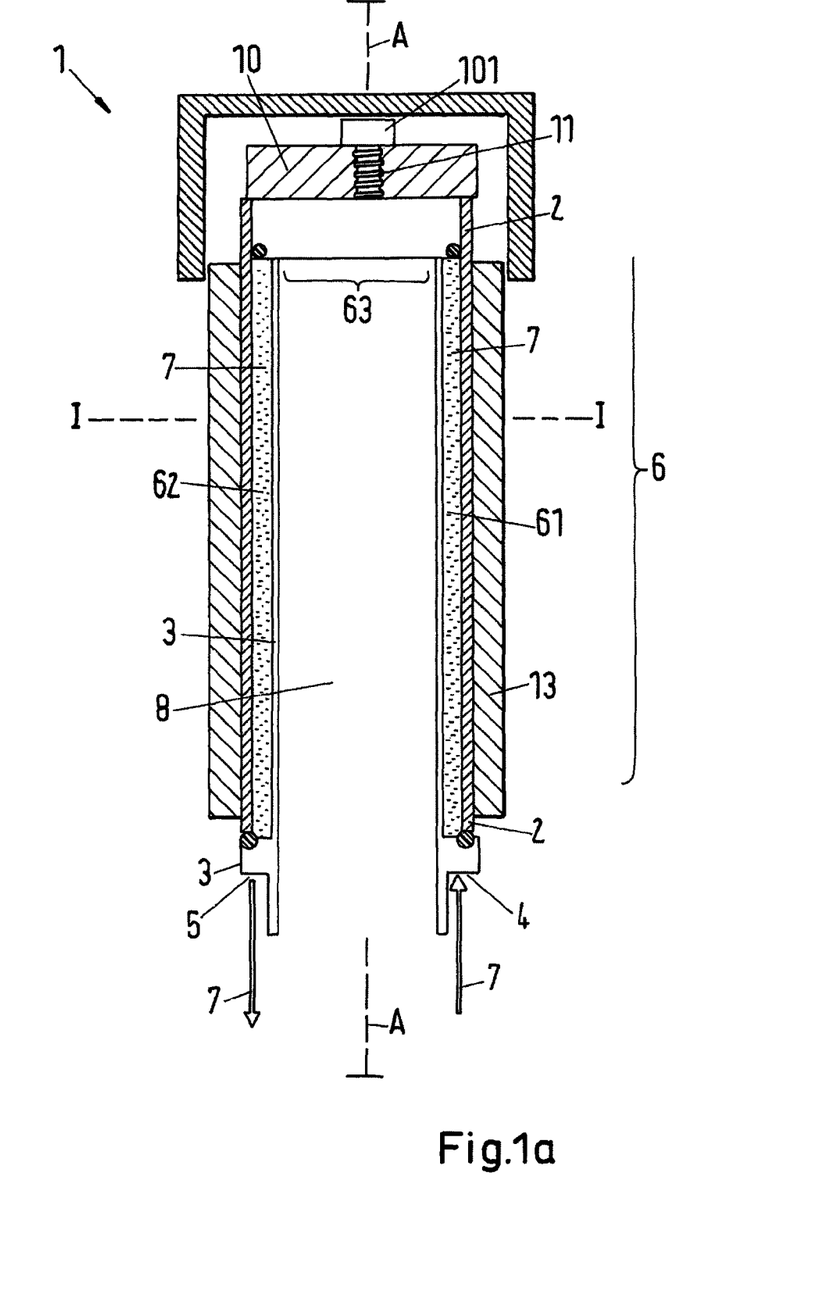
FIG. 1a shows a first simple embodiment of an evaporation source in accordance with the invention.
Figure 1B:
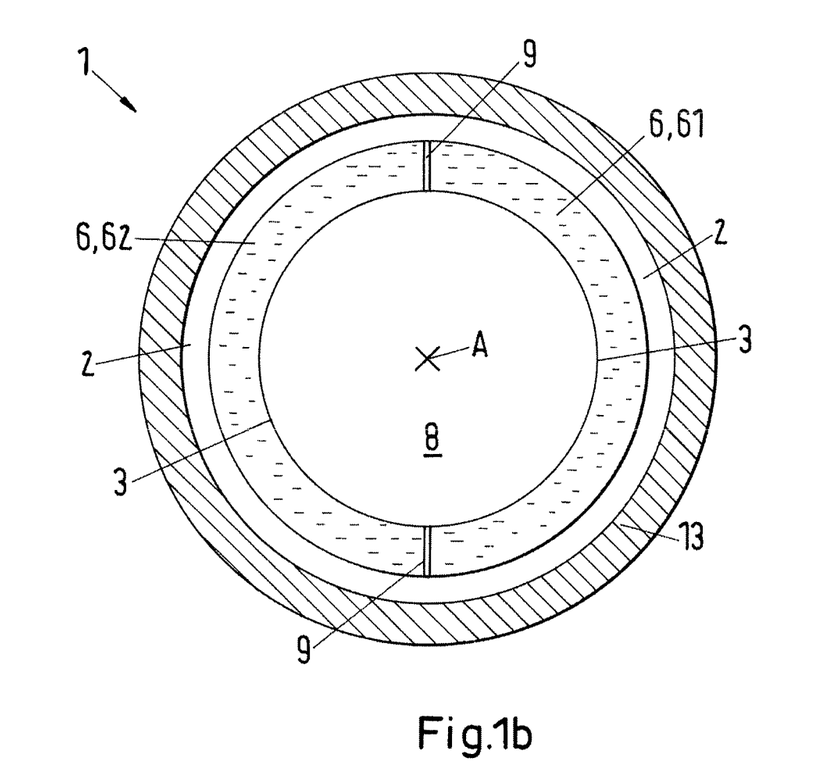

FIG. 1a shows in a schematic representation a simple embodiment of an evaporation source in accordance with the invention which will be designated in the following as a whole by the reference numeral 1, with FIG. 1b showing a section along the line I-I in accordance with FIG. 1a for better understanding.

The evaporation source 1 in accordance with the invention in accordance with FIG. 1a and FIG. 1b is in particular designed for use in a sputtering process or in a vacuum arc evaporation process, preferably for use in a cathode vacuum arc evaporation process. The evaporation source 1 includes an inner base body 3 which is arranged in an outer carrier body 2 and which is arranged with respect to the outer carrier body 2 such that a cooling space 6 in flow communication with an inlet 4 and an outlet 5 is formed between the base body 3 and the carrier body 2. In accordance with the present invention, the cooling space 6 in the present special example includes an inflow space 61 and an outflow space 62 which can each form a cylindrical half-ring body such as can also be seen particularly clearly from FIG. 1b. The inflow space 61 is in this respect in flow communication with the outflow space 62 via an overflow connection 63 such that a cooling fluid 7 can be conveyed from the inlet 4 via the inflow space 61, the overflow connection 63 and the outflow space 62 to the outlet 5. In FIG. 1a, the overflow connection 63 cannot be seen directly because it is masked by the representation of the fixing plate 10. In principle, the overflow connection 62 is, however, of a similar design to the embodiment of FIG. 3a to be discussed below.

In the evaporation source 1 of FIG. 1a and FIG. 1b, the outer carrier body 2 is a cylindrical target carrier and the inner base body 3 is a cylindrical base cooling body, wherein the outer carrier body 2 is arranged coaxial to the base body 3 with respect to an evaporator axis A.

The base body 3 surrounds a magnet system space 8 which is free of the cooling fluid 7 and in which in practice an adjustable magnet system is very frequently provided.

The inflow space 61 is separated from the outflow space 62 by a partition wall 9 in accordance with FIG. 1b. In practice, simply water is preferably used as the cooling fluid. In specific cases, however, a different fluid such as an oil can also be considered as the cooling fluid or in specific cases possibly even a gaseous fluid.

The carrier body 2 is fixed to the base body 3 by a fixing plate 10 at the upper end of the evaporation source in accordance with the drawing, with the fixing plate 10 being fixed to the base body 3 by a fixing element 101, here by a screw. To compensate a different thermal expansion of the outer carrier body 2, which is made from aluminum, for example, and on which the target material 13 is provided, and of the inner base body 3 which is made from stainless steel, for example, an expansion element 11 is provided in the form of a spiral spring so that mechanical strains between the carrier body 2 and the base body 3 due to different coefficients of thermal expansion can be avoided.

Figure 2:
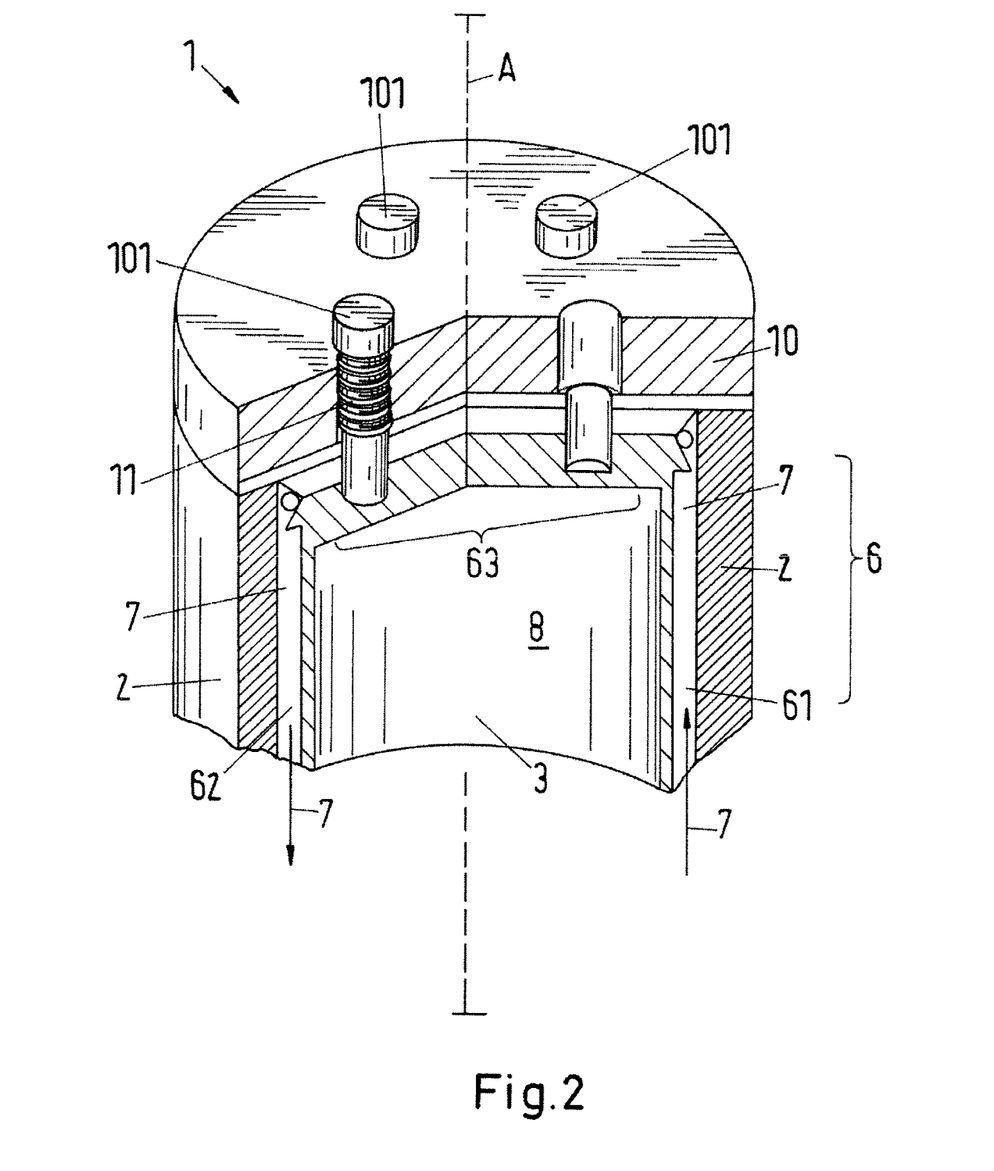
FIG. 2 shows a second embodiment with an expansion element at the fixing plate.

FIG. 2 shows a second embodiment of an evaporation source 1 in accordance with the invention having an expansion element 11 at the fixing plate 10 in a somewhat more exact representation. The fixing plate 10 is fixed by a total of four fixing elements 101 which are here common screws, e.g. M6 class 8.8 screws. A respective spring is provided as the expansion element 11 at the screws and can e.g. have a preload of approximately 120 N and a nominal load of approximately 240 N, for example with a spring travel of approximately 2 mm such as is typically selected with a target of approximately 5 mm in length. The spring travel can be adapted accordingly with longer or shorter targets. In this respect an M6 class 8.8 screw can easily be preloaded by 9000 N. Only three screws are mounted in FIG. 2 in this respect.

Figures 3A, 3B:
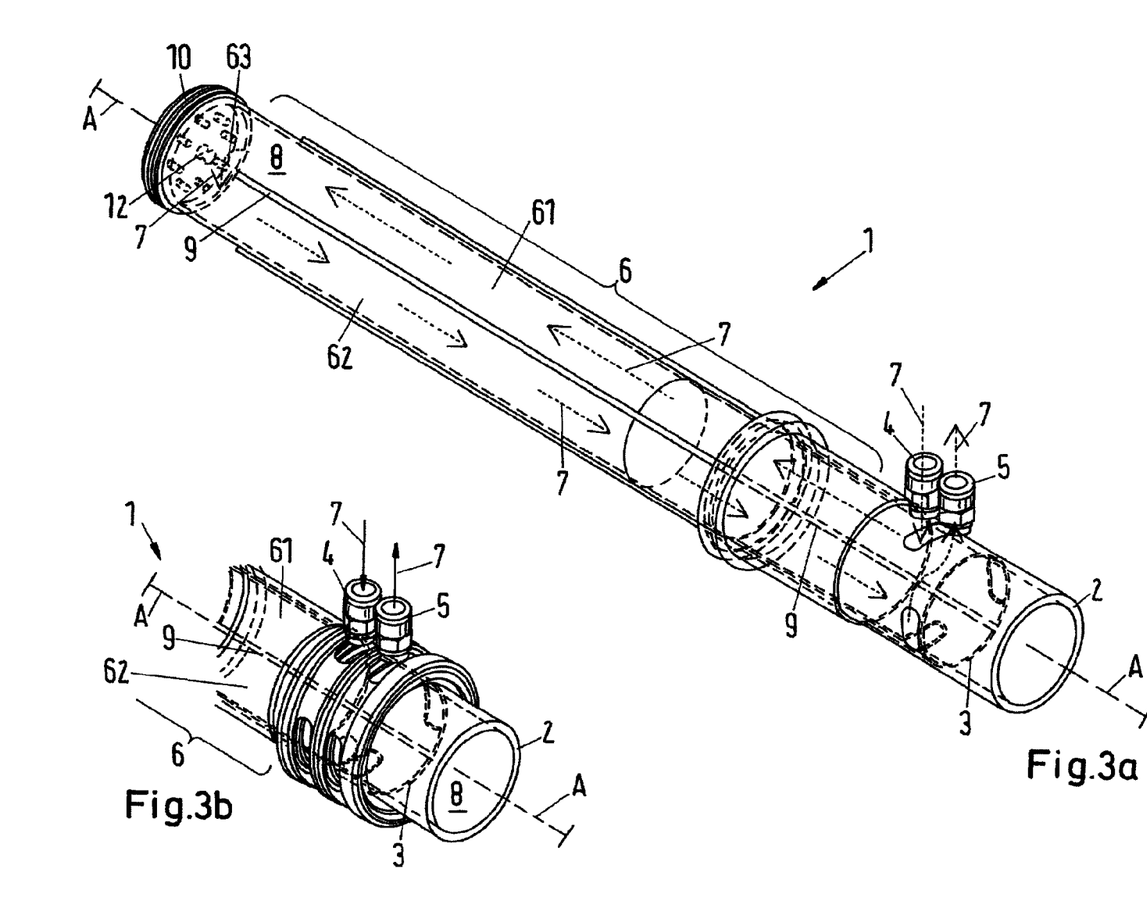
FIG. 3a shows a third embodiment with a linear coolant supply.
FIG. 3b shows an embodiment in accordance with FIG. 3a with an annular supply.

FIG. 3a shows a third embodiment with a linear coolant supply, whereas FIG. 3b shows an embodiment in accordance with FIG. 3a with an annular supply looped around the outer carrier body 2. FIG. 3a and FIG. 3b are in this respect greatly schematic in that certain components are shown as transparent or are not shown at all so that the arrangement of the partition wall 9 can be seen particularly clearly so that the flow of the cooling fluid 7 through the cooling space 6 induced by it can be observed better.

It is self-explanatory in this respect that the previously explained embodiment variants shown schematically in the Figures can also advantageously be combined with one another to form further embodiments to meet specific demands in practice. Simple further developments obvious to the skilled person are naturally furthermore also covered by the invention.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects.

Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. An evaporation source comprising:
an evaporator axis;
a cylindrical carrier body comprising an inner surface and an axis that is coaxial with the evaporator axis;
a cylindrical base body arranged within the outer carrier body;
the base body comprising an outermost surface and an axis that is coaxial with the evaporator axis;
the outermost surface facing radially outwards toward the inner surface and the inner surface facing radially inward toward the outermost surface;
a cooling fluid space arranged between the outermost surface of the base body and the inner surface of the carrier body;
a partition wall separating the cooling space into an inflow space and an outflow space;
said inflow space having an arc-shaped cross-section; and
said outflow space having an arc-shaped cross-section,
wherein the cooling fluid space is configured to allow fluid to move in one direction within the inflow space and in an opposite direction within the outflow space.

2. The evaporation source of claim 1, wherein the partition wall comprises two partition walls.

3. The evaporation source of claim 2, wherein the inflow space and the outflow space have a same arc-shaped cross-section.

4. The evaporation source of claim 1, wherein the partition wall comprises two oppositely arranged partition walls.

5. The evaporation source of claim 1, further comprising a main internal space located within the base body sized and configured to receive therein a magnet system.

6. The evaporation source of claim 1, further comprising a cooling fluid inlet, a cooling fluid outlet and an outflow connection arranged on an opposite end from the cooling fluid inlet and the cooling fluid outlet.

7. The evaporation source of claim 1, wherein at least the carrier body is rotatable about the evaporator axis.

8. The evaporation source of claim 1, wherein at least the base body is rotatable about the evaporator axis.

9. The evaporation source of claim 1, further comprising one of:
a fixing plate adapted to fix the carrier body to the base body; and
a fixing element coupled to a fixing plate.

10. The evaporation source of claim 9, further comprising one of:
a thermal expansion element coupled to the fixing plate; and
a spring coupled to the fixing plate.

11. The evaporation source of claim 1, wherein at least one of:
the carrier body comprises a target material; or
a cylindrical target material is arranged on an outer surface of the carrier body.

12. The evaporation source of claim 1, wherein at least one of:
the inflow space is structured and arranged to generate turbulence in the cooling fluid flowing therein;
the outflow space is structured and arranged to generate turbulence in the cooling fluid flowing therein; or
a turbulence body is arranged within the evaporation source and is adapted to generate turbulence in the cooling fluid.

13. The evaporation source of claim 1, wherein at least one of:
the inlet is a meandering inlet; or
the outlet is a meandering outlet.

14. The evaporation source of claim 1, further comprising a magnet system space located within the base body sized and configured to contain therein one of:
a movable carrier system;
a magnet having a predetermined magnetic field strength; or
a magnet having a predetermined magnetic field shape.

15. The evaporation source of claim 1, wherein the evaporation source is usable in one of:
a sputtering process;
a vacuum arc evaporation process; or
a cathode vacuum arc evaporation process.

16. An evaporation source comprising:
a carrier body comprising a cylindrical inner surface and an axis;
a base body arranged within the outer carrier body comprising a cylindrical outermost surface and an axis that is coaxial with the axis of the carrier body;
the cylindrical outermost surface being spaced from the cylindrical inner surface;
a cooling fluid space arranged between the cylindrical outermost surface of the base body and the cylindrical inner surface of the carrier body;
a magnet receiving space located within the base body; and
partition walls separating the cooling space into an arc-shaped inflow space and an arc-shaped outflow space having a same outer diameter as the arc-shaped inflow space,
wherein a cooling fluid moves within the inflow space and the outflow space in opposite directions without passing through the magnet receiving space.

17. The evaporation source of claim 16, further comprising a cooling fluid inlet, a cooling fluid outlet and an outflow connection arranged on an opposite end from the cooling fluid inlet and the cooling fluid outlet.

18. An evaporation source comprising:
a cylindrical carrier body comprising a cylindrical inner surface and an axis;
a target material arranged on an outer cylindrical surface of the carrier body;
a cylindrical base body arranged within the outer carrier body;
the cylindrical base body comprising a cylindrical outermost surface and an axis that is coaxial with the axis of the carrier body;
a cylindrical cooling fluid space arranged between the cylindrical outermost surface of the base body and the cylindrical inner surface of the carrier body;
a magnet receiving space located within the base body; and
oppositely arranged partition walls separating the cooling space into an arc-shaped inflow space and an arc-shaped outflow space having a same inside diameter as the arc-shaped inflow space,
wherein a cooling fluid moves within the inflow space along a direction parallel to the axis of the carrier body and within the outflow space parallel to the axis of the carrier body and in an opposite direction.

19. The evaporation source of claim 18, wherein at least one of:
   the carrier body is rotatable; and
   the base body is rotatable.

20. The evaporation source of claim 18, wherein the magnet receiving space is surrounded by a cylindrical wall of the cylindrical base body, wherein the cooling fluid does not flow through the magnet receiving space.

21. The evaporation source of claim 1, further comprising a cylindrical magnet system receiving space surrounded by the cylindrical base body, wherein the fluid does not flow through the magnet system receiving space.

22. The evaporation source of claim 16, wherein the magnet receiving space is surrounded by a cylindrical wall of the base body, wherein the fluid does not flow through the magnet receiving space.

23. The evaporation source of claim 1, wherein at least one of:
   the inflow space has a same size and shape as the outflow space; or
   the inflow space has a same inside diameter and a same outside diameter as the outflow space.

24. The evaporation source of claim 16, wherein at least one of:
   the inflow space has a same size and shape as the outflow space; or
   the inflow space has a same inside diameter as the outflow space.

* * * * *